(12) United States Patent
Yang

(10) Patent No.: US 6,875,658 B2
(45) Date of Patent: Apr. 5, 2005

(54) HIGH-VOLTAGE DEVICE WITH IMPROVED PUNCH THROUGH VOLTAGE AND PROCESS FOR SAME COMPATIBLE WITH LOW-VOLTAGE DEVICE PROCESS

(75) Inventor: Hsiao-Ying Yang, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 10/447,152

(22) Filed: May 29, 2003

(65) Prior Publication Data
US 2004/0238902 A1 Dec. 2, 2004

(51) Int. Cl.$^7$ .......................................... H01L 21/8234
(52) U.S. Cl. .................. 438/275; 438/217; 438/289; 438/519; 438/301; 438/303; 438/305; 438/306; 257/391; 257/392; 257/408; 257/500
(58) Field of Search .................. 438/217, 275, 438/276, 289, 298, 519, 546, 549, 301–307; 257/382–388, 391–392, 408, 413, 500

(56) References Cited

U.S. PATENT DOCUMENTS

| | | | | | |
|---|---|---|---|---|---|
| 4,590,663 A | * | 5/1986 | Haken | ........................ | 438/231 |
| 5,024,960 A | * | 6/1991 | Haken | ........................ | 438/200 |
| 5,516,711 A | * | 5/1996 | Wang | ........................ | 438/217 |
| 5,532,176 A | * | 7/1996 | Katada et al. | .............. | 438/232 |
| 5,614,432 A | * | 3/1997 | Goto | ........................ | 438/231 |
| 5,686,324 A | * | 11/1997 | Wang et al. | ................ | 438/231 |
| 5,834,352 A | * | 11/1998 | Choi | ........................ | 438/275 |
| 6,077,736 A | * | 6/2000 | Hwang et al. | .............. | 438/231 |
| 6,084,283 A | * | 7/2000 | Arai | ........................ | 257/500 |
| 6,297,108 B1 | * | 10/2001 | Chu | ........................ | 438/297 |
| 6,350,665 B1 | * | 2/2002 | Jin et al. | .................... | 438/585 |
| 6,479,339 B2 | * | 11/2002 | Nandakumar et al. | ...... | 438/232 |
| 6,509,243 B2 | | 1/2003 | Fan | | |

* cited by examiner

Primary Examiner—George Eckert
Assistant Examiner—Edgardo Ortiz
(74) Attorney, Agent, or Firm—Birch, Stewart, Kolasch & Birch, LLP

(57) ABSTRACT

A high-voltage device with improved punch through voltage. A semiconductor silicon substrate has a high-voltage device region on which a gate structure is patterned. A lightly doped region is formed in the substrate and lateral to the gate structure. A spacer is formed on the sidewall of the gate structure. A heavily doped region is formed in the lightly doped region and lateral to the spacer. A lateral distance is kept between the spacer and the heavily doped region.

6 Claims, 6 Drawing Sheets

HIGH-VOLTAGE DEVICE WITH IMPROVED PUNCH THROUGH VOLTAGE AND PROCESS FOR SAME COMPATIBLE WITH LOW-VOLTAGE DEVICE PROCESS

BACKGROUND OF THE INVENTION

1. Field of the Invention

The invention relates to a method for integrating a high-voltage (HV) device and a low-voltage (LV) device, and more particularly to an HV device process compatible with an LV process for an HV device with a narrowed width design, which increases punch through voltage and bulk-drain voltage ($V_{BD}$) thereof.

2. Description of the Related Art

In the current semiconductor manufacturing process, controllers, memories, low-voltage (LV) circuits and power high-voltage (HV) devices are largely integrated into a single chip to achieve a single-chip system. The power device, such as VDMOS, IGBT and LDMOS, is employed to increase power switching efficiency and decrease the loss of energy resources. Since HV and LV devices with different breakdown voltages are required on a single chip, achieving compatibility in the HV and LV device process has become an important issue.

In the conventional HV device process, a polysilicon gate formed on a silicon substrate is used as a mask and then a self-aligned source/drain region with a double diffused drain (DDD) structure is formed in the silicon substrate. Commonly, in order to suppress the hot electron effect and to increase the breakdown voltage in the source/drain region, a lightly doped region is formed in the silicon substrate under the source/drain region, and then a high-temperature drive-in process is performed to form the DDD structure. However, in the procedure integrating HV and LV devices, the structure and thermal budget for the HV device are different from those for the LV device. The grade region, the drive-in process on the lightly doped region for the DDD structure may vary in the diffusing regions of the LV device, resulting in unstable electrical properties in the LV device.

U.S. Pat. No. 6,509,243 discloses a method for integrating HV and LV devices, which is now described with reference to FIGS. 1A~1E. In FIG. 1A, a semiconductor silicon substrate 10 comprises an HV device region 12H and an LV device region 12L. First, a nitride insulating layer 16 is deposited on the substrate 10, and the nitride insulating layer 16 is then patterned to expose a portion of the substrate 10 used as a predetermined isolation region. An oxidation process is then performed on the exposed portion of the substrate 10 to form a field oxide isolation region 14 which isolates the HV device region 12H from the LV device region 12L.

Next, in FIG. 1B, a photoresist layer 18 is formed on the substrate 10 to expose a portion of the nitride insulating layer 16 in the HV device region 12H, in which the substrate 10 under the exposed portion corresponds to a predetermined source/drain region of the HV device region 12H. Then, using ion implantation with the photoresist layer 18 as a mask, a doped region 20 is formed in the substrate 10 under the exposed portion of the nitride insulating layer 16. Next, in FIG. 1C, after sequentially removing the photoresist layer 18 and the nitride insulating layer 16, a high-temperature drive-in process is performed to forwardly diffuse the doped ions in the doped region 20 into the substrate 10 and laterally diffuse into a portion under the field isolation region 14, thus the doped region 20 is transformed into a grade diffusion region 20a.

Next, in FIG. 1D, an HV gate structure 26H and an LV gate structure 26L are formed on the substrate 10 in the HV device region 12H and the LV device region 12L, respectively. Each HV gate structure 26H and the LV gate structure 26L comprises a gate oxide layer 22 and a polysilicon gate layer 24, and the grade diffusion region 20a in the substrate 10 is at the periphery of the HV gate structure 26H.

Next, in FIG. 1E, after covering the HV device region 12H with a photoresist material, light implantation performed employing with the LV gate structure 26L as a mask, a lightly doped region 28 is formed in the substrate 10 within the LV device region 12L. After removing the photoresist material from the HV device region 12H, an insulating spacer 30 is formed on the sidewalls of the HV gate structure 26H and the LV gate structure 26L. Then, heavy implantation is performed employing the HV gate structure 26H, the LV gate structure 26L and the insulating spacer 30 as a mask, a heavily doped region 32H is formed in the grade diffusion region 20a within the HV device region 12H, and a heavily doped region 32L is formed in the lightly doped region 28 within the LV device region 12L. Therefore, in the HV device region 12H, the combination of the grade diffusion region 20a and the lightly doped region 32H serves as a double diffused drain (DDD) structure. In the LV device region, the heavily doped region 32L serves as a source/drain region, and the lightly doped region 28 serves as a lightly doped drain (LDD) structure.

In a narrowed width design for an HV device, however, it is difficult to control the bulk-drain voltage ($V_{BD}$) of the HV device because t heavy implantation is performed in the HV device region 12H and the LV device region 12L simultaneously. Also, as the channel length decreases, the electron punch through issue becomes problematic. Accordingly, an HV device process which can increase the active distance between the source region and the drain region of the HV device is called for.

SUMMARY OF THE INVENTION

The present invention is an HV device process compatible with an LV device process for improving the punch through voltage and bulk-drain voltage of an HV device.

Accordingly, the present invention provides a high-voltage device process compatible with a low-voltage device process for a high-voltage device with improved punch through voltage. First, a semiconductor silicon substrate is provided with a high-voltage device region and a low-voltage device region. The high-voltage device region and the low-voltage device region each comprise a gate structure formed on the substrate, a lightly doped region formed in the substrate and lateral to the gate structure, and a spacer formed on the sidewall of the gate structure; forming a first photoresist layer on the substrate to cover the high-voltage device region. Then, a first heavy implantation is performed in the low-voltage device region with the gate structure and the spacer as a mask to form a first heavily doped region in the exposed portion of the lightly doped region. After removing the first photoresist layer, a resist protection oxide layer is formed on the substrate to cover the high-voltage device region and the low-voltage device region. Next, a second photoresist layer is formed on the substrate to cover the low-voltage device region. Next, a second heavy implantation is performed in the high-voltage device region with the gate structure and the spacer as a mask to form a second heavily doped region in the exposed portion of the lightly doped region. A lateral distance is kept between the spacer and the second heavily doped region.

Accordingly, the present invention also provides a high-voltage device with improved punch through voltage. A semiconductor silicon substrate has a high-voltage device region on which a gate structure is patterned. A lightly doped region is formed in the substrate and lateral to the gate structure. A spacer is formed on the sidewall of the gate structure. A heavily doped region is formed in the lightly doped region and lateral to the spacer. A lateral distance is kept between the spacer and the heavily doped region.

DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

FIGS. 2A to 2E are sectional diagrams illustrating an HV device process compatible with an LV device process.

Figure 1A:
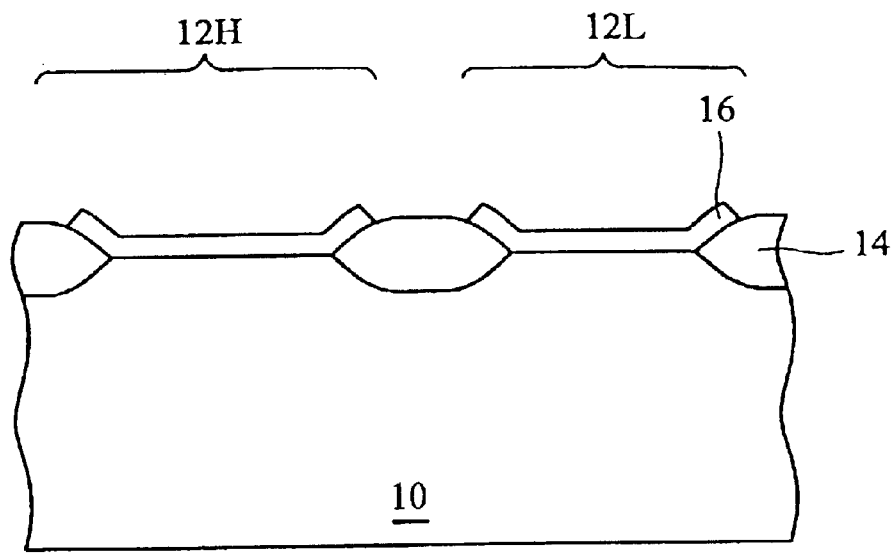
FIGS. 1A to 1E are sectional diagrams illustrating a conventional method for integrating HV and LV devices
Figure 1B:
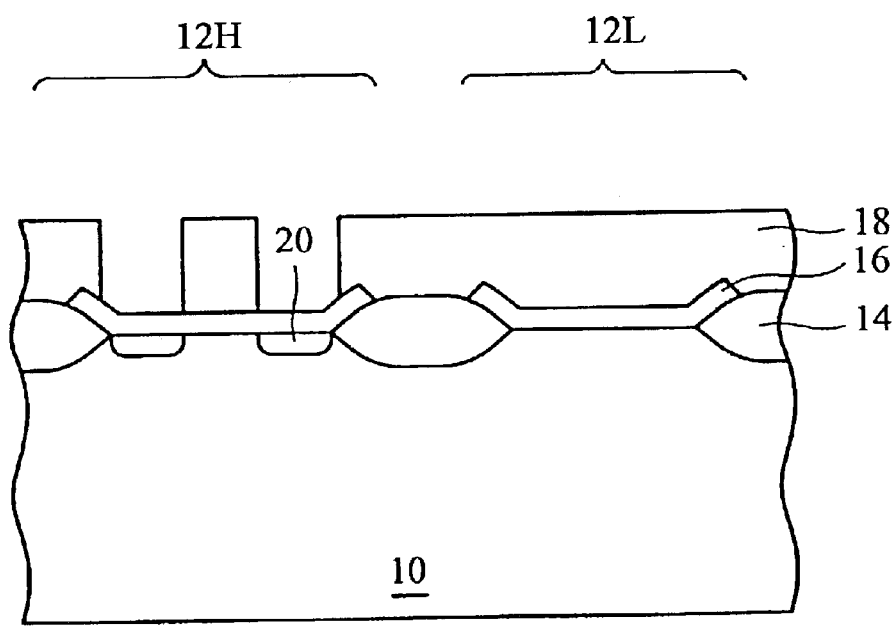
Figure 1C:
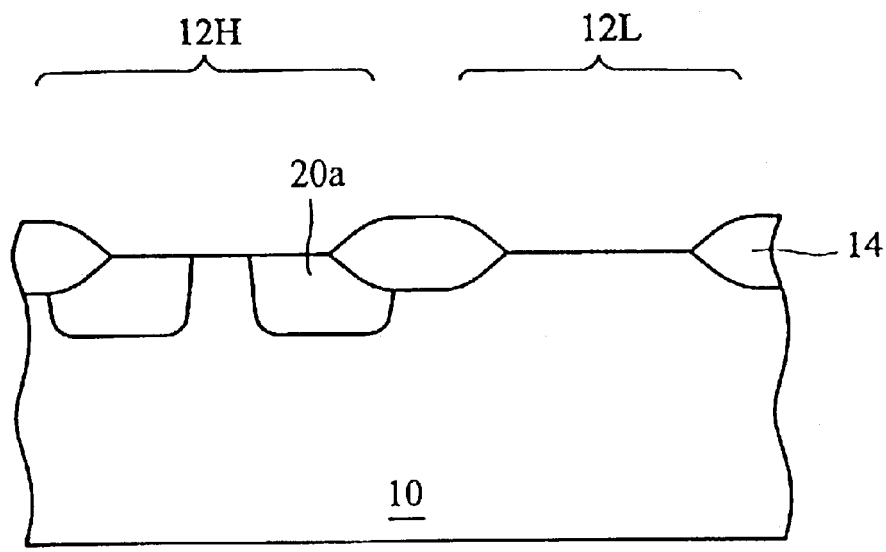
Figure 1D:
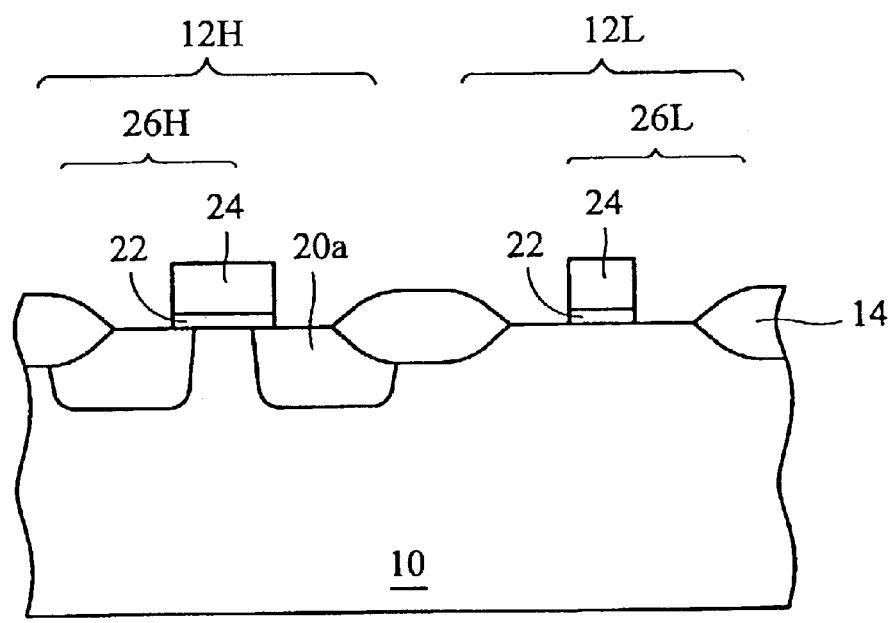
Figure 1E:
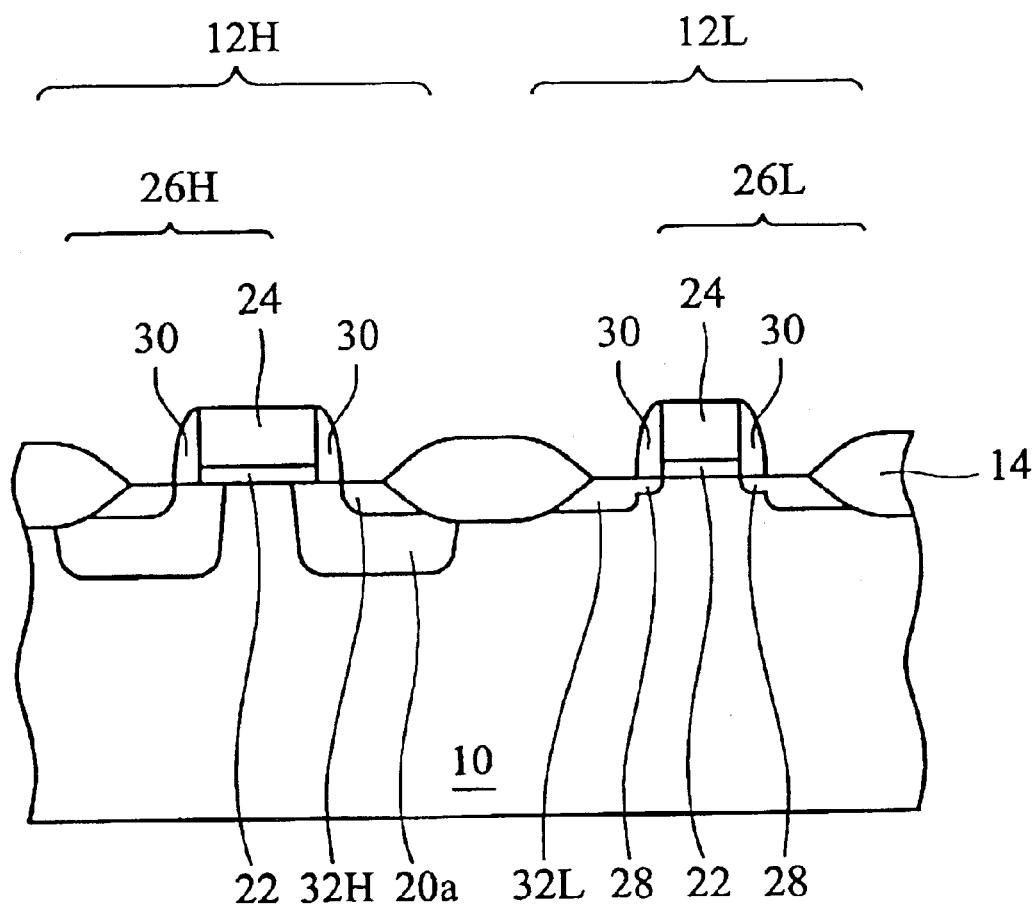
Figure 2A:
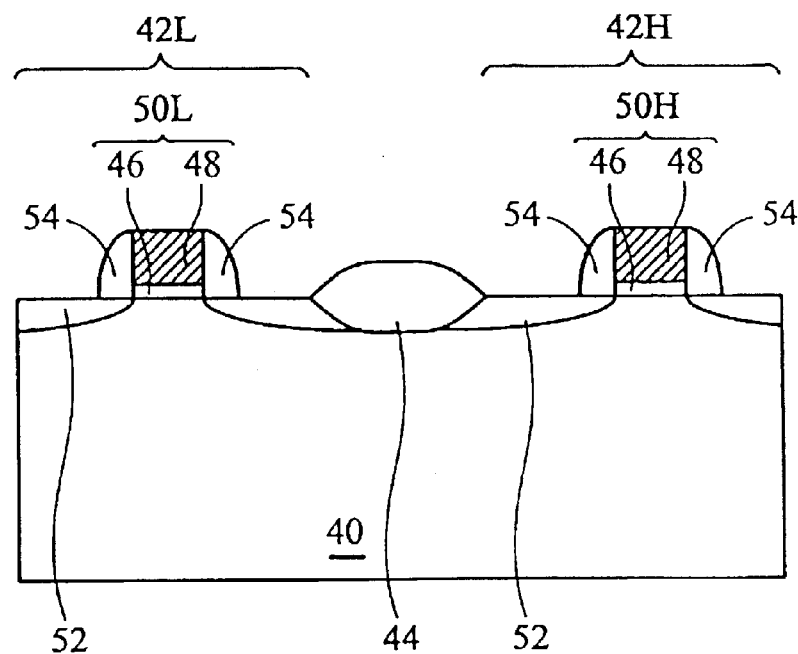
FIGS. 2A to 2E are sectional diagrams illustrating an HV device process compatible with an LV device process.

In FIG. 2A, an HV device region 42H and an LV device region 42L are defined on a semiconductor silicon substrate 40. A field oxide isolation region 44 is formed on the substrate 40 to isolate the HV device region 42H from the LV device region 42L. AN HV gate structure 50H is formed on the substrate 40 in the HV device region 42H, an LV gate structure 50L is formed on the substrate 40 in the LV device region 42L, and a lightly doped region 52 is formed in the substrate 40 at the peripheries of the HV gate structure 50H and the LV gate structure 50L. Additionally, an insulating spacer 54 is formed on the sidewalls of the HV gate structure 50H and the LV gate structure 50L.

Preferably, each HV gate structure 50H and the LV gate structure 50L is a stack composed of a gate insulating layer 46 and a gate conductive layer 48. The lightly doped region 52 is an N⁻-doped region. The sequence and materials for the fabrication of the lightly doped region 52, the HV gate structure 50H, the LV gate structure 50L and the insulating spacer 54 are design choices without further limitations.

Figure 2B:
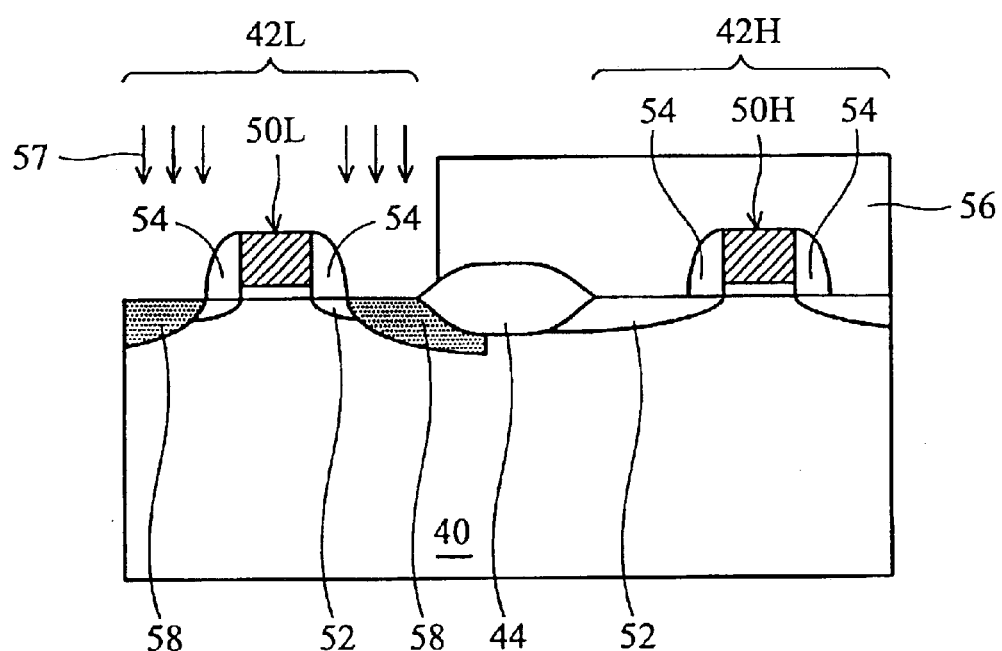

Then, in FIG. 2B, a first photoresist layer 56 is formed on the substrate 40 to cover the HV device region 42H, thus exposing the LV device region 42L. Next, a first heavy implantation 57 is performed employing the LV gate structure SOL and the insulating spacer 54 as a mask, thus a first heavily doped region 58 is formed in the exposed portion of the lightly doped region 52. Preferably, an N⁺-implantation is performed to form an N⁺-doped region 58 in the exposed portion of the N⁻-doped region 52. Thus, in the LV device region 42L, the first heavily doped region 58 serves as a source/drain region, and the lightly doped region 52 serves as a LDD structure.

Figure 2C:
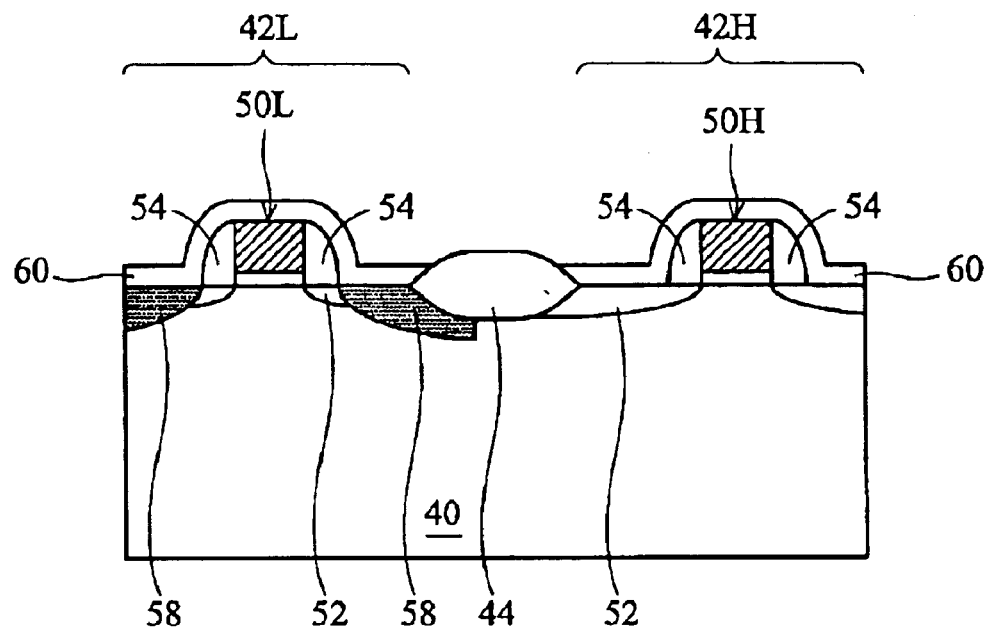
Figure 2D:
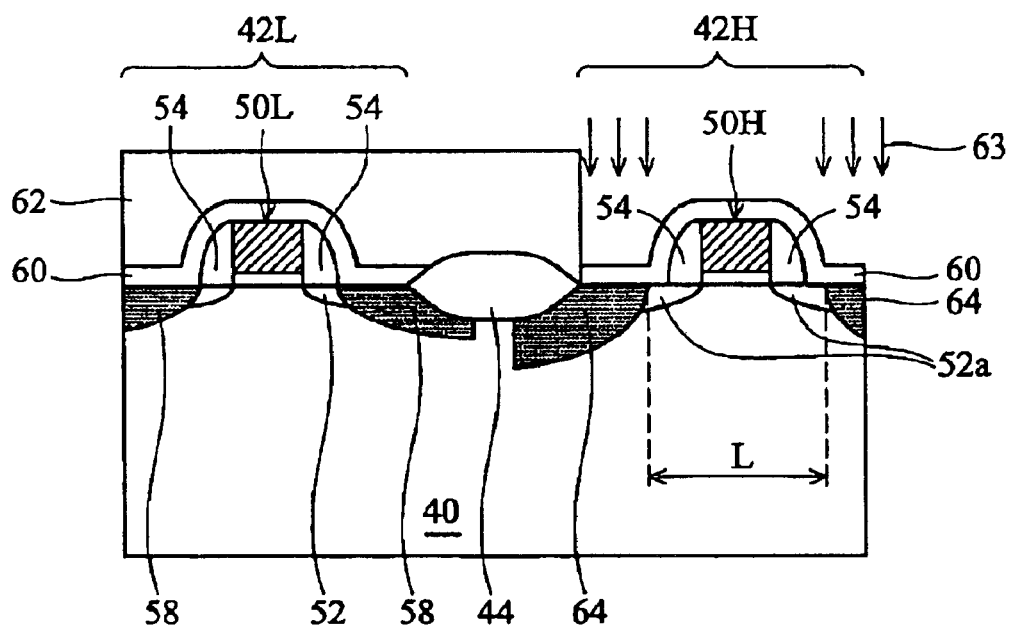

Next, in FIG. 2C, after removing the first photoresist layer 56, a resist protection oxide (RFO) layer 60 is deposited on the substrate 40 to cover the HV device region 2H and the LV device region 42L. Then, in FIG. 2D, a second photoresist layer 62 is formed on the substrate 40 to cover the LV device region 42L, thus exposing the HV device region 42H. Next, a second heavy implantation 63 is performed employing the HV gate structure 50H, the insulating spacer 54 and a portion of the RPO Nayer 60 disposed on the insulating spacer 54 as a mask, thus a second heavily doped region 64 is formed in the exposed portion of the lightly doped region 52. Preferably, an N⁺-implantation is performed to form an N⁺-doped region 64 in the exposed portion of the N⁻-doped region 52. Then, using a high-temperature drive-in process, the doped ions in the lightly doped region 52 forwardly diffuse into the substrate 40 and laterally diffuse into a portion under the field isolation region 44, thus the lightly doped region 52 is transformed into a grade diffusion region 52a. Thus, in the HV device region 42H, the second heavily doped region 64 serves as a source/drain region.

According to the above-described step, a portion of the RPO layer 60 disposed on the insulating spacer 54 is used as the mask of the second heavy implantation 63, thus an active distance L between the source region and the drain region is increased corresponding to the thickness of the RPO layer 60. This can effectively increase the channel length of the HV device thus improving the punch through voltage and the bulk-drain voltage ($V_{BD}$).

Figure 2E:
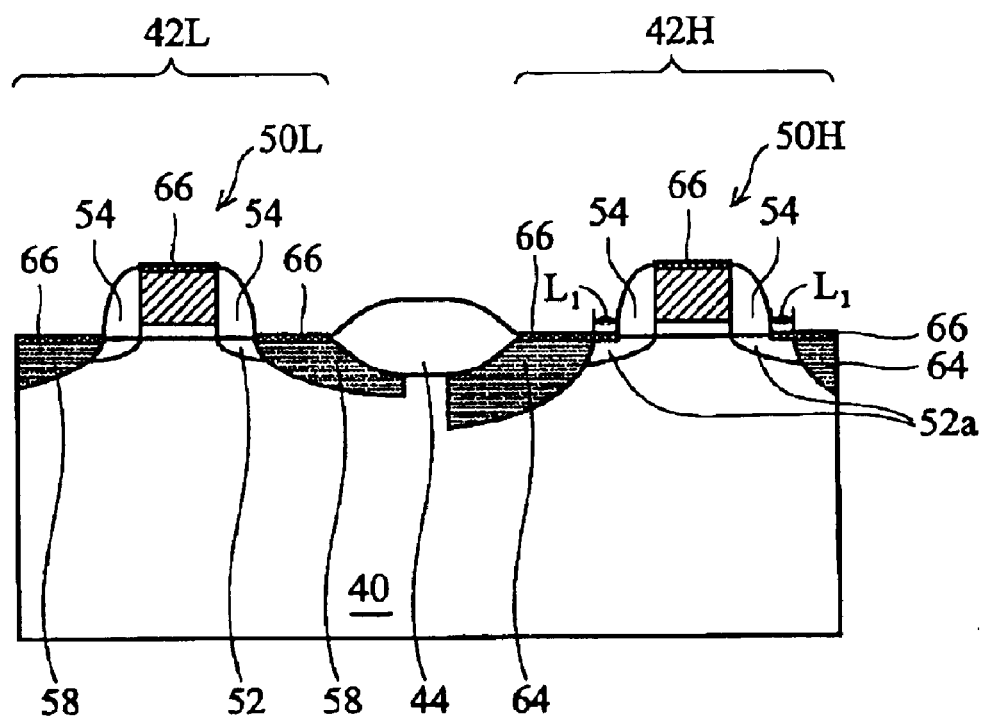

Finally, in FIG. 2E, after sequentially removing the second photoresist layer 62 and the RPO layer 60, a silicidation process is performed to form a self-aligned silicide layer (called a salicide layer) 66 on the exposed surfaces of the gate structures 50H and 50L and the source/drain regions 58 and 64, thus achieving the purpose of reducing resistance. For example, when the gate conductive layer 48 is a polysilicon layer, a metal layer of Co or Ti of approximately 300~800 Å in thickness is deposited to cover the exposed surfaces of the gate structures 50H and 50L and the source/drain regions 58 and 64. Then, using a thermal treatment, metal atoms in the metal layer diffuse downward to react with silicon atoms in the polysilicon layer 48 and silicon substrate 40, resulting in a $TiSi_2$ layer or a $CoSi_2$ layer. Then, a selective etching process is used to remove the non-reacted portion of the metal layer.

The present invention has the following advantages. First, in FIG. 2E, since a portion of the RPO layer 60 disposed on the insulating spacer 54 is used as the mask of the second heavy implantation 63, a lateral distance $L_1$ is kept between the second heavily doped region 64 and the insulating spacer 54 in the HV device region 42H. Therefore, in comparison with the conventional HV device, the prevent invention increases the lateral distance between two of the second heavily doped regions 64 as twice $L_1$ thus improving the punch through voltage and the bulk-drain voltage ($V_{BD}$) of the HV device. Second, the formation of the first heavily doped region 58 in the LV device region 42L occurs prior to the formation of the second heavily doped region 64 in the HV device region 42H, thus the shortcomings caused by simultaneously performing implantation in the HV device region and the LV device region are avoided.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A high-voltage device process compatible with a low-voltage device process for a high-voltage device with improved punch through voltage, comprising steps of:

proving a semiconductor silicon substrate comprising a high-voltage device region and a low-voltage device region, wherein each of the high-voltage device region and the low-voltage device region comprises a gate structure formed on the substrate, a lightly doped region formed in the substrate and lateral to the gate structure, and a spacer formed on the sidewall of the gate structure;

forming a first photoresist layer on the substrate to cover the high-voltage device region;

performing a first heavy implantation in the low-voltage device region with the gate structure and the spacer as a mask to form a first heavily doped region in the exposed portion of the lightly doped region;

removing the first photoresist layer;

forming a resist protection oxide layer on the substrate to cover the high-voltage device region and the low-voltage device region;

forming a second photoresist layer on the substrate to cover the low-voltage device region; and performing a second heavy implantation in the high-voltage device region with the gate structure and the spacer as a mask to form a second heavily doped region in the exposed portion of the lightly doped region, wherein, a lateral distance is kept between an outside edge of the spacer and the second heavily doped region.

2. The high-voltage device process compatible with a low-voltage device process for a high-voltage device with improved punch through voltage of claim 1, further comprising steps of:

removing the second photoresist layer;

removing the resist protection oxide layer; and performing a silicidation process to form a self-aligned silicide layer on the exposed surfaces of the gate structure, the lightly doped region, and the heavily doped region.

3. The high-voltage device process compatible with a low-voltage device process for a high-voltage device with improved punch through voltage of claim 1, wherein the semiconductor silicon substrate further comprises an isolation region which separates the high-voltage device region from the low-voltage device region.

4. The high-voltage device process compatible with a low-voltage device process for a high-voltage device with improved punch through voltage of claim 1, wherein the gate structure comprises a gate insulating layer and a gate conductive layer.

5. The high-voltage device process compatible with a low-voltage device process for a high-voltage device with improved punch through voltage of claim 1, wherein the lightly doped region and the heavily doped region comprises the same conductive-type dopants.

6. The high-voltage device process compatible with a low-voltage device process for a high-voltage device with improved punch through voltage of claim 1, wherein a part of the resist protection oxide layer adjacent to the spacer is used as a mask to block the second heavy implantation in the high-voltage device for resulting the lateral distance between the spacer and the second heavily doped region.

* * * * *